United States Patent [19]

Pyle

[11] Patent Number: 5,418,452
[45] Date of Patent: May 23, 1995

[54] APPARATUS FOR TESTING INTEGRATED CIRCUITS USING TIME DIVISION MULTIPLEXING

[75] Inventor: Norman C. Pyle, Longmont, Colo.

[73] Assignee: Fujitsu Limited, Kanagawa, Japan

[21] Appl. No.: 36,926

[22] Filed: Mar. 25, 1993

[51] Int. Cl.⁶ .......................................... G01R 31/28
[52] U.S. Cl. ................... 324/158.1; 324/73.1
[58] Field of Search ............... 324/158 R, 73.1, 72.5, 324/158.1; 371/22.4, 22.6, 25, 15.1; 437/8

[56] References Cited

U.S. PATENT DOCUMENTS

| | | | |
|---|---|---|---|
| 4,956,602 | 9/1990 | Parrish | 324/158 R |
| 4,961,053 | 10/1990 | Krug | 324/73.1 |
| 5,053,700 | 10/1991 | Parrish | 324/158 R |
| 5,059,899 | 10/1991 | Farnworth et al. | 324/73.1 |
| 5,241,266 | 8/1993 | Ahmad et al. | 324/158 R |

Primary Examiner—Vinh Nguyen
Attorney, Agent, or Firm—Sheridan Ross & McIntosh

[57] ABSTRACT

An apparatus for observing dedicated test nodes of an integrated circuit (IC) substantially simultaneously while limiting the number of necessary IC pins is provided. The apparatus utilizes time division multiplexing (TDM) to provide a plurality of signals to a logic analyzer from test nodes within an integrated circuit through a single output pin. A multiplexer receives a plurality of signals from IC test nodes and provides an interleaved stream of time slices from each signal on its output. The signals are demultiplexed and reconstructed by the logic analyzer. Sampling of the signals must be fast enough to satisfy the Nyquist criterion for sampling speed. In another embodiment, the apparatus provides a multiplexer hierarchy to increase the total number of observable test nodes. Test node signals which are known to have slow transition rates are grouped and input into a lower-level multiplexer. The output of the lower-level multiplexer is then fed into the input of a higher-level multiplexer which is connected to the logic analyzer.

17 Claims, 5 Drawing Sheets

5,418,452

APPARATUS FOR TESTING INTEGRATED CIRCUITS USING TIME DIVISION MULTIPLEXING

FIELD OF THE INVENTION

The present invention relates to an apparatus for testing of integrated circuits.

BACKGROUND OF THE INVENTION

During recent years in the computer industry, utilization of integrated circuits (ICs) has grown steadily. The use of ICs has helped decrease the size, cost of and power consumption of circuit boards. However, as the size and use of ICs have increased, so has their complexity, thereby necessitating a need for a design of readily testable circuits.

Engineers have responded to this problem by providing each IC with dedicated test points for observation of internal circuit nodes. This has allowed for better component observability as well as easier isolation of faults during a lab debugging of the circuit. One drawback to this method is that the dedicated test points add to the number of necessary IC pins and to the overall size and cost of the circuit. Typically, integrated circuits are established on a silicon substrate and then encapsulated within a plastic or ceramic shell with input pins and output pins extending through the shell to provide signal paths between the integrated circuitry and other components in a system. Adding IC pins for testing purposes requires a substantial amount of space and to some extent defeats the advantage of using an IC circuit (i.e. to provide a high degree of functionality within a relatively small area).

In order to reduce the number of necessary output IC pins, each dedicated test point can be connected to the input of a multiplexer (MUX). For example, if sixteen dedicated test points are included in an IC, four 4-to-1 multiplexers could be used to output the signals from these test points. However, with the IC test MUXs used in the past, only one signal input into each MUX may be observed at a time. The IC test MUXs used in the past have comprised simple switches, wherein the output of the MUX is determined via input control pins by whoever is performing the debug.

This method has clear disadvantages. For example, two test signals input into the same MUX cannot be viewed simultaneously. Also, if four MUXs are used, only four output signals can be viewed simultaneously. Some complicated debugging schemes may require that more data be available concurrently. In addition, since each MUX usually requires a number of input control pins, the total number of IC pins is not substantially decreased. Thus, it would be advantageous to increase the number of simultaneously observable dedicated test points while decreasing the number of IC pins and the overall size and cost of the circuit.

Time division multiplexing (TDM) has been used in the past by the communications industry in order to subdivide the capacity of a digital transmission facility. In communications a situation is often encountered wherein a plurality of sources contend for the use of a single transmission line. Rather than allocating the transmission line to one of the plurality of sources until its transmission is completed, TDM allows for all of the sources to transmit data substantially simultaneously.

A time division MUX is provided with a clocked counter such that the MUX sequentially samples its next consecutive input when the counter is incremented. Thus a stream of interleaved data from each of the input sources is sent over the transmission line. Data from the input sources can be either bit interleaved or word interleaved depending on the desired application. For bit interleaving each input source is allocated an output time slot corresponding to a single bit. For example, a 4-to-1 multiplexer using bit interleaving would output a bit stream of 123412341234 . . . , wherein the numbers represent the input source being sampled. Alternatively, with word interleaving, each input source is allocated a longer output time slot corresponding to more than a single bit, referred to as a word. Again using a 4-to-1 multiplexer, an output bit stream of 1111222233334444 . . . may be produced. In this instance the "word" consists of four bits.

On the receiving end of the transmission line, the stream of interleaved bits or words are "demultiplexed" and the original wave forms are reconstructed. In order for the receiver to determine which bit corresponds to which source, the same clock (taking into account transmission overhead), or synchronization information in another form, must be provided to the demultiplexer.

Also, the clock must be set to run at a sufficiently high rate to meet the Nyquist sampling criterion and avoid aliasing. The Nyquist sampling criterion states that the rate of sampling be at least twice as high as the highest input frequency. The sampling rate for a TDM multiplexer is equal to the clock frequency which controls the MUX divided by the number of MUX inputs. Therefore, the minimum frequency for a clock controlling a TDM multiplexer equals the product of the highest input frequency, the number of MUX inputs, and two. For example, if a 4-to-1 MUX is used, the clock rate must be at least eight times as high as the transition rate of the fastest source signal since each source signal is only sampled once every four times the counter is incremented. TDM can thus be used to allocate voice and data communications links from more than one source substantially simultaneously.

SUMMARY OF THE INVENTION

Accordingly, one object of the present invention is to provide a method and apparatus for testing an integrated circuit wherein the number of substantially simultaneously observable test nodes is increased over prior art schemes.

Another object of the present invention is to provide increased substantially simultaneously observable test nodes of an integrated circuit without significantly increasing the number of necessary pins on the IC chip.

Still another object of the present invention is to increase the total number of observable test nodes of an integrated circuit without increasing the number of necessary pins on the IC chip.

In one embodiment of the present invention, an integrated circuit is provided with a multiplexer and a clocked counter. The multiplexer receives input signals from dedicated test nodes included in the integrated circuitry. The clocked counter is interconnected with the control pins of the multiplexer so as to cause the multiplexer to sequentially sample a different input each time the counter is incremented. The multiplexer includes one output which feeds data to a logic analyzer. The data transmitted by the multiplexer on its output comprises an interleaved stream of bits representing time slices from each of the signals on the multiplexer inputs. The interleaved stream of bits are then demultiplexed at the logic analyzer and the signals from the dedicated test nodes of the integrated circuit are reconstructed.

In another embodiment of the present invention, the integrated circuit is provided with a hierarchy of multiplexers and corresponding clocked counters. In this embodiment, groups of signals from dedicated test nodes which are known to have relatively slow transition rates are grouped and input into lower-level multiplexers. Since the incoming signals have relatively slow transition rates, the sampling rates of the lower-level MUXs are also relatively slow. The outputs of the lower-level MUXs as well as signals from dedicated test nodes known to have a relatively high transition rate are then fed into a higher-level MUX which has a relatively high sampling rate. Therefore, the output of the higher-level MUX includes time slices from a greater number of dedicated test node signals than if only a single MUX were used. Further, this method does not increase the output pin count of the IC chip as only one MUX output is connected to the logic analyzer.

In another embodiment of the present invention, the clocked counters which control the sampling rates of the MUXs are disposed on the same IC chip as the integrated circuitry and MUXs, and "shadow counters," connected to the same control lines as the on-chip counters, are provided on a separate chip or chips for connection to the logic analyzer. The logic analyzer must receive the same counts as the MUXs in order to demultiplex the interleaved bit stream. This method presents a way to provide the necessary clocked counts to the logic analyzer with a pin savings on the IC chip.

DETAILED DESCRIPTION

Figure 1:
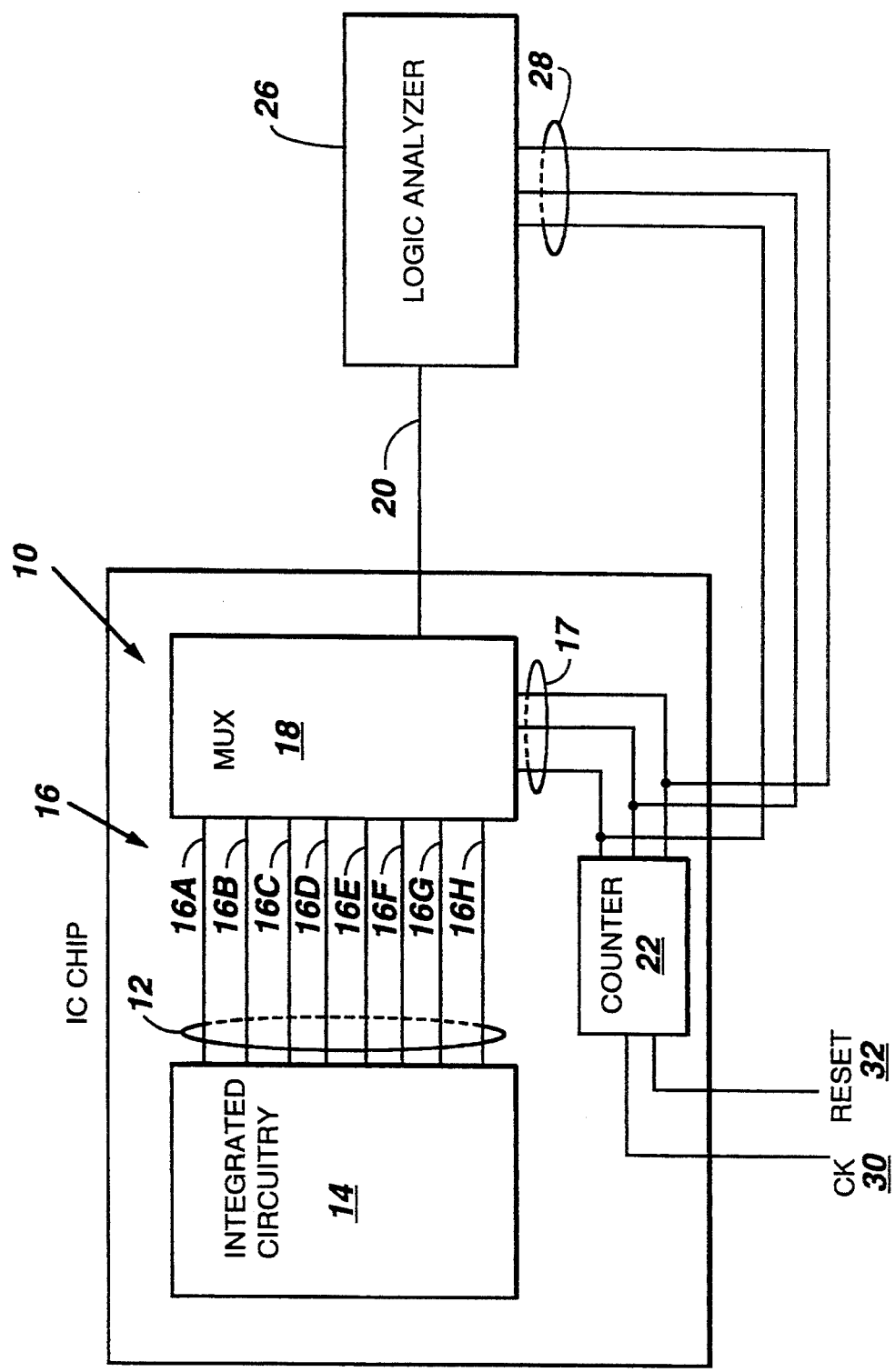
FIG. 1 is a block diagram of one embodiment of the present invention.
Figure 1A:
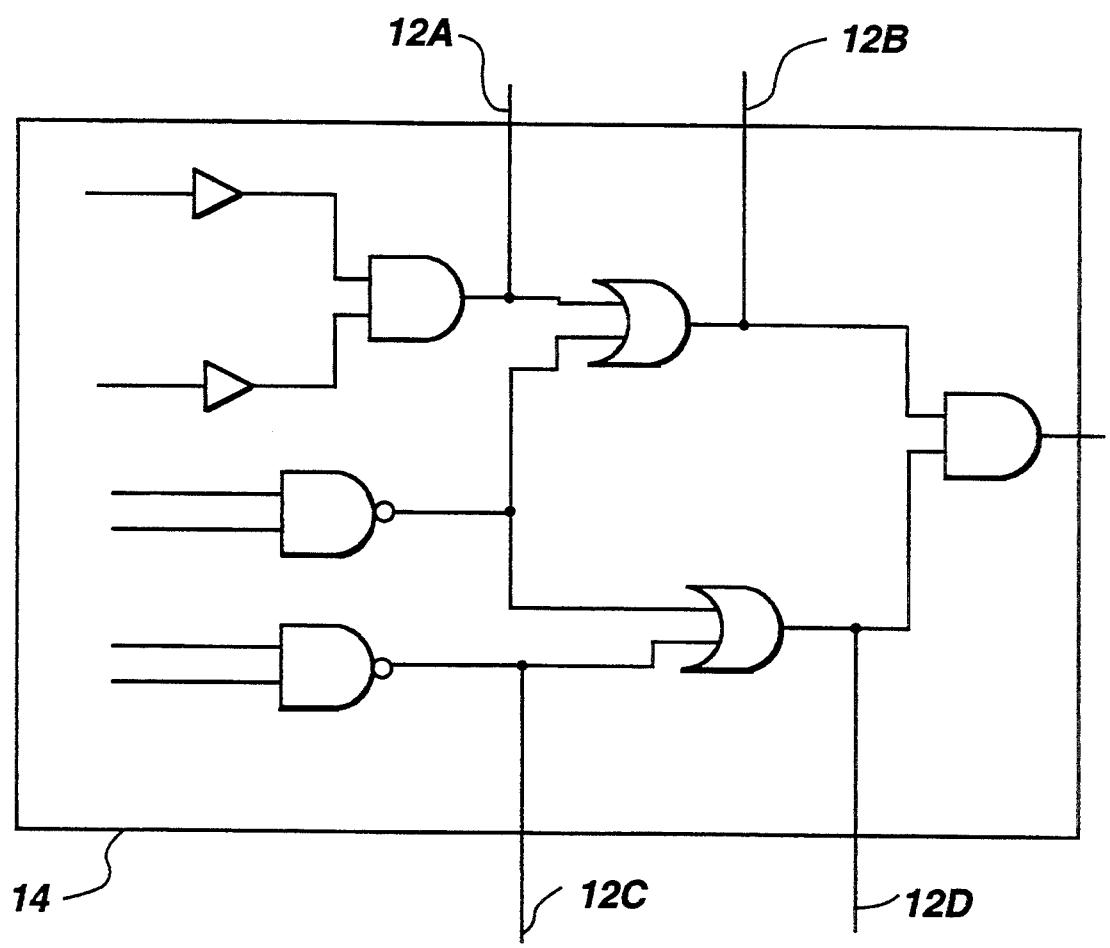
FIG. 1A is an illustration of an example of the integrated circuitry and corresponding test nodes of the present invention.

One embodiment of the present invention is illustrated in FIG. 1. Integrated circuitry 14 is disposed on integrated circuit chip 10. Integrated circuitry 14 may comprise any number of integratable circuits and preferably includes a number of dedicated test points to facilitate debugging. Dedicated test points consist of specific nodes in integrated circuitry 14 such as those shown in FIG. 1A by reference numbers 12a–12d. Multiplexer (MUX) 18 is also disposed on IC chip 10 and includes inputs 16, control lines 17 and output 20. Multiplexer inputs 16 are connected to dedicated test points within integrated circuitry 14, and control lines 17 are connected to counter 22 which is also disposed on IC chip 10. MUX output 20 is interconnected with logic analyzer 26 which receives the same count signals from counter 22 as MUX 18 through inputs 28.

If it is found that integrated circuit chip 10 is not operating properly, it may be necessary to perform a laboratory debugging of the circuit. Initially, the person performing the debugging resets counter 22 via reset line 32. In the example shown in FIG. 1, MUX 18 has eight inputs, thus a three bit counter 22 is necessary. In this instance, counter 22 is reset to binary 000. When MUX 18 receives binary 000 from counter 22 it samples the signal on its first input 16a. Input 16a is interconnected with one of a plurality of test points within integrated circuitry 14. As long as binary 000 appears on its control inputs 17, MUX 18 will output the signal being received at input 16a over output line 20.

When the clock signal being received by counter 22 over line 30 makes a transition, counter 22 will increment its output to binary 001. When MUX 18 receives 001 on its control inputs 17, it will begin to output the signal it is receiving on input 16b over output line 20. This procedure continues until counter 22 reaches binary 111 which causes MUX 18 to output the signal it is receiving on input 16h. When the clock signal on line 30 again makes a transition, counter 22 will reset to 000 and MUX 18 will again begin to output the signal on its first input 16a. This cyclical process will repeat itself until clock signal on line 30 is discontinued.

This process produces, on output line 20, an interleaved stream of samples or "time-slices" from each of the signals on the inputs of MUX 18. In the present embodiment, output line 20 would transmit ordered time-slices from signals on inputs 16a 16b 16c . . . 16g 16h 16a 16b . . . 16g 16h etc. Logic analyzer 26 preferably includes demultiplexing circuitry in order to reconstruct the signals from the time-slices carried by line 20. In order to demultiplex the interleaved stream of time-slices, logic analyzer 26 must be able to determine which time slice corresponds with a specific signal from a test node. In order to make such a distinction, logic analyzer 26 is provided, via control inputs 28, the same count values as multiplexer 18.

Importantly, in order to accurately reconstruct the test node signals, the clock signal present on line 30 must be of sufficiently high frequency to satisfy the Nyquist criterion for sampling. Specifically, the frequency of the clock signal on line 30 must be at least 16 times as high as the transition rate of the fastest test node signal fed into inputs 16 (because MUX 18 has eight inputs and each signal must be sampled at least twice as fast as its transition rate). This avoids the problem of aliasing and interference between samples on output line 20 which would introduce errors during reconstruction of the signals. Also, satisfying the Nyquist criterion ensures that the test node signals are sampled often enough that no transition between logic levels will go undetected which would thereby decrease the accuracy of the reconstructed signals.

Since the samples from the test node signals are interleaved time-slices, the signals can be reconstructed essentially in parallel. In effect, no reconstructed signal will ever be more than one period "behind" any other reconstructed signal. Thus, the test node signals can be displayed and analyzed by logic analyzer 26 substantially simultaneously. In prior art systems, only one signal input into a multiplexer could be viewed at any one time. The present invention provides for easier debugging as signals can be directly compared.

Figure 2:
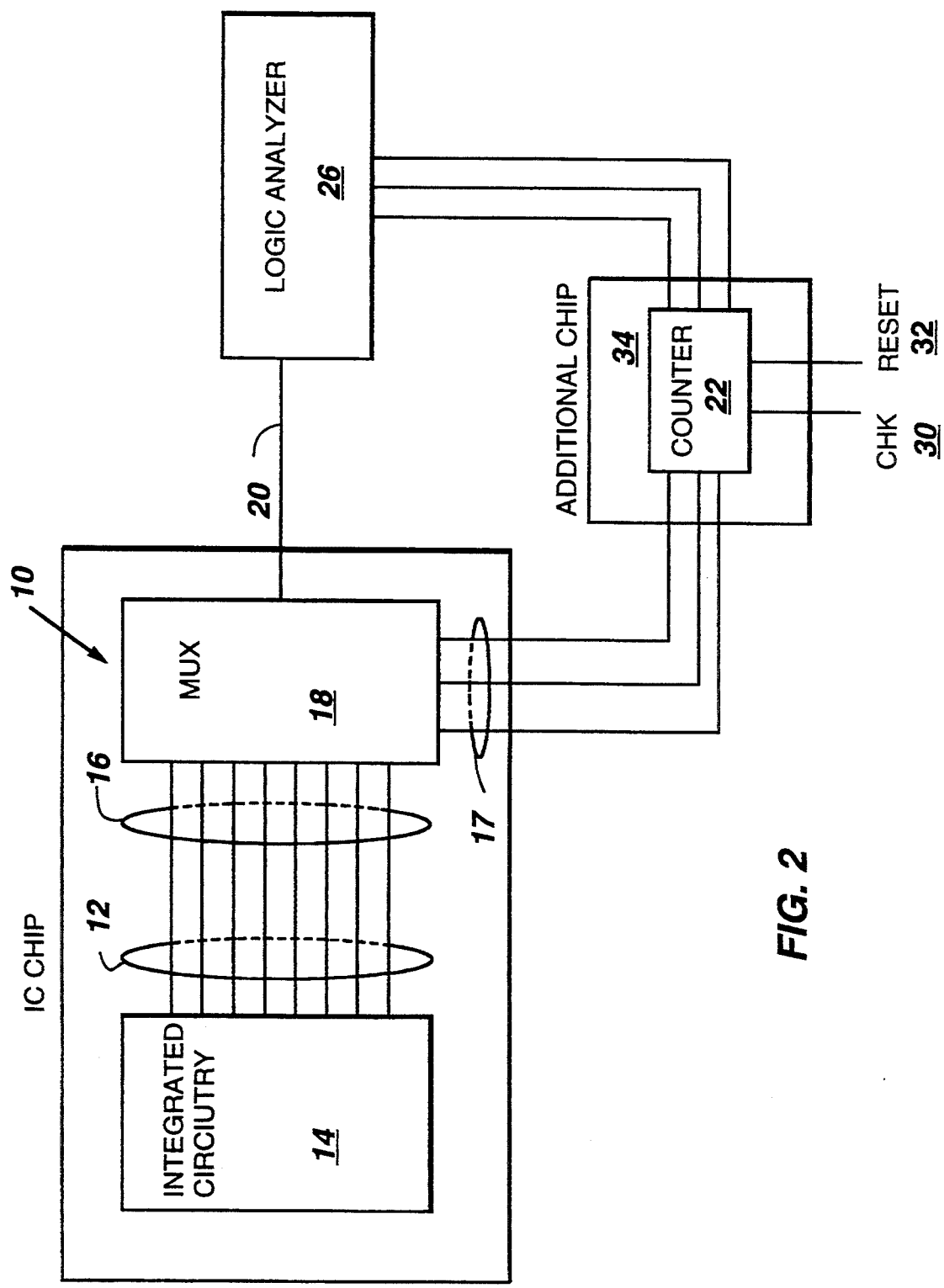
FIG. 2 is a block diagram of another embodiment of the present invention.

FIG. 2 illustrates another embodiment of the present invention. As discussed, one of the overriding concerns in the design of an integrated circuit is the reduction of the pins needed on the integrated circuit chip. In FIG. 2, counter 22 is disposed on an additional circuit chip 34. This limits the number of pins on IC chip 10 dedicated to the testing function to four as opposed to the six pins required in the design of FIG. 1. Other than the change in position of counter 22, the system operates identically to the system illustrated in FIG. 1.

Figure 3:
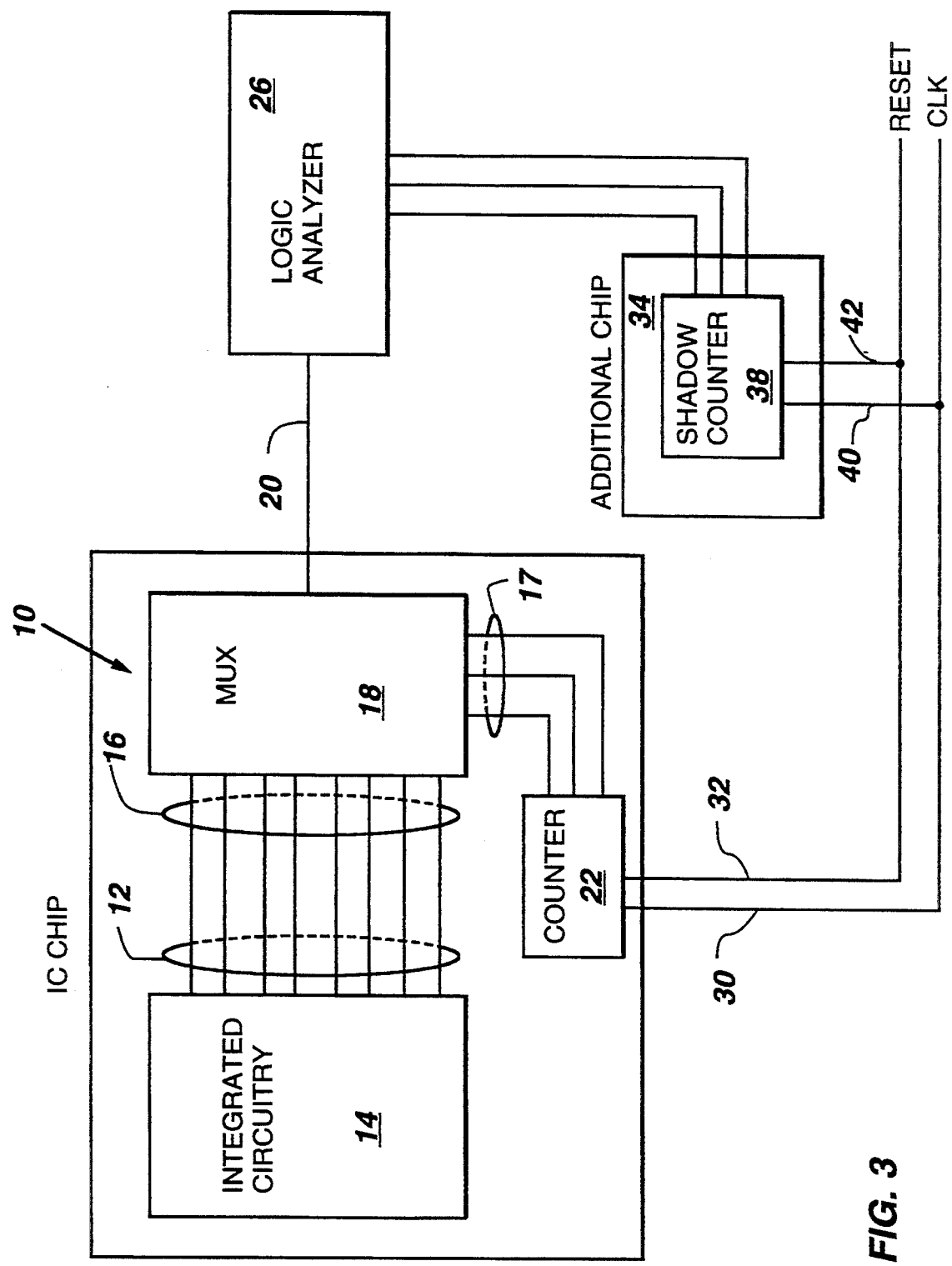
FIG. 3 is a block diagram of still another embodiment of the present invention.

FIG. 3 illustrates another embodiment of the present invention in which the number of pins on the IC chip 10 dedicated to a test function is limited to three. In this embodiment, counter 22 is again disposed directly on the IC chip; however, the outputs of counter 22 are not fed to logic analyzer 26, thereby eliminating the need for three output pins. Instead, additional chip 34 is provided with a shadow counter 38 which receives the same clock and reset control signals as counter 22 over lines 40 and 42. Shadow counter 38 thus increments its count in synchronization with counter 22. Logic analyzer control inputs 28 are connected to the outputs of shadow counter 38, and since the counts from counter 22 and shadow counter 38 are identical, logic analyzer 26 is able to utilize the data on its control inputs 28 to demultiplex the interleaved stream of samples on line 20 from MUX 18.

Note that many logic analyzers include a pattern generator function which could be used to provide clock and reset values to counter 22. In addition, some pattern generators included in logic analyzers could be used as shadow counter 38 thereby eliminating the need for additional circuit chip 34. If the particular logic analyzer 26 employed does not include a pattern generator function which could be used to provide clock and reset signals over lines 30 and 32, an additional piece of off-chip hardware (not shown) is provided to perform these functions.

Figure 4:
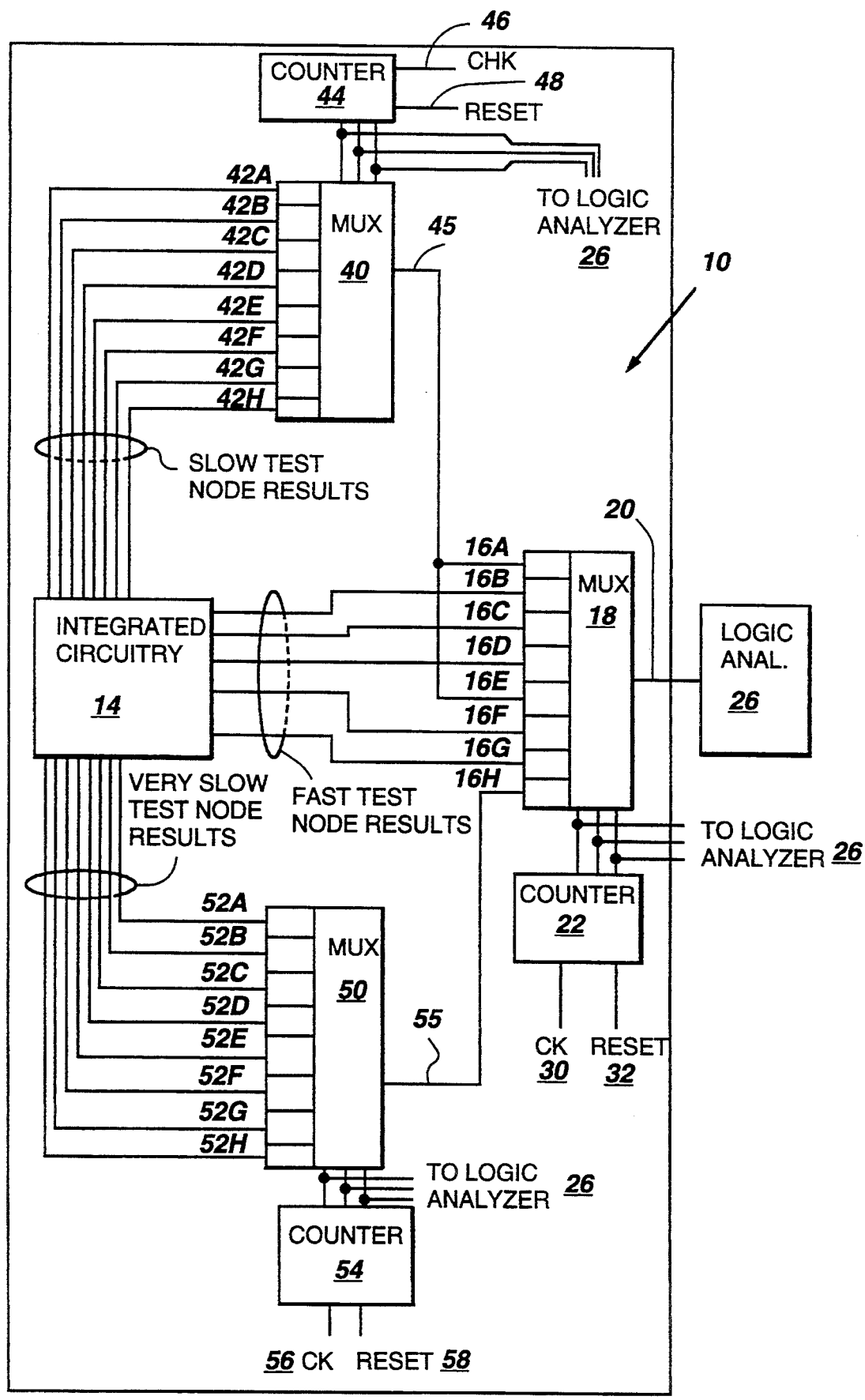
FIG. 4 is a block diagram of an embodiment of the present invention employing a hierarchy of multiplexers.

All of the embodiments depicted in FIGS. 1–3 address the need for substantially simultaneous observation of multiple test nodes. FIG. 4 illustrates an embodiment of the present invention which additionally addresses the need for an increase in the total number of observable test nodes without affecting the IC chip pin count. Two additional MUXs 40 and 50 are provided and their outputs, 45 and 55 respectively, are fed into MUX 18 to create a MUX hierarchy and increase the number of observable nodes while not affecting the number of output pins necessary on IC chip 10.

In this embodiment the dedicated test nodes of integrated circuitry 14 are divided into groups according to their transition rates. In the example shown, test nodes outputting signals with very slow transition rates as compared to the rest of the test node signals are input into MUX 50. MUX 50 is controlled by a three-bit counter 54 and clock line 56 which are independent of the control mechanism for MUX 18. The clock signal on control line 56 must be fast enough to satisfy the Nyquist criterion for sampling of the signals on inputs 52a–52h. For the sake of example, assume that the fastest test node signal input into MUX 50 has a frequency of 1 kHz. According to the previously explained Nyquist criterion, the signal on clock input 56 must have a frequency of at least 16 kHz in order to avoid aliasing and allow for the accurate reconstruction of the signals Output 55 of MUX 50 is connected to input 16h of MUX 18.

MUX 40 is provided to multiplex a group of test node signals which are relatively slow as compared to some other test node signals but are faster than those signals input into MUX 50. Counter 44 is provided to control MUX 40. Again, for the sake of example, assume that the transition rate of the fastest signals on inputs 42a–42h is 2 kHz. The signal on clock input 46 then must have a frequency of at least 32 kHz in order to satisfy the Nyquist criterion. The output of MUX 45 is split and connected to inputs 16a and 16e. The reasons for this split will become apparent upon further description.

In addition to the outputs of MUXs 40 and 50, several dedicated test nodes of integrated circuitry 14 are directly connected to inputs of MUX 18. All of these "directly connected" nodes produce signals which are fast relative to other test node signals. Assume that the fastest of the signals produced by the directly connected nodes has a frequency of 4 kHz.

In order to determine the minimum frequency at which the signal on clock input 30 must operate, all of the inputs into MUX 18 must be considered. Beginning with the directly connected test nodes which produce relatively fast signal, the fastest of these signals, as discussed, is 4 kHz. This requires that the signal on clock input 30 have a minimum frequency of 64 kHz in order to satisfy the Nyquist criterion.

As described above, the signal on clock input 44 operates at a frequency of 32 kHz. Therefore the output signal on line 45 has a frequency of 32 kHz, and the signal on clock input 30 must have a high enough frequency to satisfy the Nyquist sampling criterion for an input signal with a frequency of 32 kHz. If output 45 were only connected to a single input of MUX 18, this would require the signal on clock input 30 to have a minimum frequency of 32 kHz multiplied by sixteen, or 512 Khz, in order to satisfy the Nyquist sampling criterion (since the output 45 of MUX 40 would only be sampled once every eight times counter 22 is incremented). However, since the output 45 of MUX 40 is connected to two separate inputs of MUX 18, the signal on output 45 is sampled once every four times counter 22 is incremented rather than once every eight times as in previous examples. Therefore, the minimum necessary frequency for the signal on clock input 30 in order to satisfy the Nyquist criterion for signals input into MUX 40 is 32 kHz multiplied by 8, or 256 kHz.

Output 55 of MUX 50 is only connected to a single input of MUX 18. Therefore, since the frequency of the output signal on line 55 is 16 kHz and MUX 18 is an 8-to-1 multiplexer, in order to satisfy the Nyquist criterion for input signals on 52a–52h, the frequency of the signal on clock input 30 must be at least 16 kHz multiplied by sixteen, or 256 kHz. Thus, the minimum sampling rate for MUX 18 in order to satisfy the Nyquist criterion for all of the test node signals is 256 kHz in the above example.

In this embodiment, a signal input into MUX 50 is sampled once every 64 times counter 22 is incremented. A signal input into MUX 40 is sampled once every 32 times counter 22 is incremented, and a signal directly fed into MUX 18 is sampled once every 8 times counter 22 is incremented. Thus, the interleaved output stream of samples appearing on output line 20 is as follows (where the numbers indicate the MUX input receiving the signal: 42a 16b 16c 16d 42b 16f 16g 52a 42c 16b 16c 16d 42d 16f 16 g 52 b 42e 16b 16c . . . etc. As shown, the signals with the fastest transition rates (those fed directly into MUX 18) appear most often in the interleaved stream of samples on output line 20. The connections of counters 22,44, and 54 to logic analyzer 26 are not shown; however, it is recognized that any of the schemes disclosed in FIGS. 1–3 for providing the same count values to MUX 18 and logic analyzer 26 could be used in this embodiment. If shadow counters are to be used then each counter 22, 44, and 54 must have a corresponding shadow counter on additional circuit chip 34. Also, it is preferable that all of reset lines 32, 48, and 58 be controlled by a single reset signal. It is also preferable that all of the clock signals fed to the counters are synchronized. This will ensure that all of the counters are synchronized when a debugging procedure is initiated.

Note that the total number of observable nodes in this embodiment is 21 as compared with 8 in the embodiments depicted in FIGS. 1–3. Note also that all of the test node signals are again observable substantially simultaneously.

Although the present invention has been described with respect to specific embodiments, it should be understood by those skilled in the art that various changes and modifications in the form and detail of the invention may be made therein without departing from the spirit and scope of the invention. For example, it is recognized that the sampling of signals coming into the multiplexer need not be performed in the consecutive order of the multiplexer inputs. In addition, it is recognized that the multiplexer hierarchy illustrated in FIG. 4 could be expanded beyond the two levels depicted. Therefore, the scope of the invention should not be limited except by the appended claims.

What is claimed is:

1. A system for observing an integrated circuitry, comprising:
    a plurality of test nodes, with said plurality of test nodes being connected to different parts of a same, non-redundant integrated circuitry;
    first multiplexing means having a plurality of first inputs and a first output, said plurality of first inputs being the same in number as said plurality of test nodes, said plurality of first inputs being transmitted along a plurality of first input conductors and said first output being transmitted along a first output conductor and in which said first output conductor is less in number than said plurality of first input conductors;
    first timing means for causing said first multiplexing means to sequentially sample signals from said test nodes for said first inputs so as to produce an interleaved stream of said sample signals that comprises said first output, said first timing means operating at a frequency at least as high as the product of two, the number of said first inputs and the highest frequency of any of said test node signals; and
    analyzing means, interconnected with said first output conductor, for using said interleaved stream on said first output conductor to observe said integrated circuitry, said analyzing means receiving at least a first sample signal and a second sample signal in which said analyzing means receives a first sample portion of said second sample signal before receiving a second sampled portion of said first sample signal, said analyzing means including means for determining that said second sample portion of said first sampled signal is to be reconstructed with said first sampled portion of said first sample signal.

2. The system as recited in claim 1, wherein:
    said plurality of test nodes includes a first set and a second set of test nodes and in which the system further comprises second multiplexing means having a plurality of second inputs interconnected with said second set of said test nodes.

3. The system as recited in claim 2, wherein said first set of test nodes produces signals having relatively fast transition rates compared to transition rates of signals produced by said second set of test nodes.

4. The system as recited in claim 3, further comprising second timing means for causing said second multiplexing means to sequentially sample signals from said second set of said test nodes on consecutive ones of said second inputs.

5. The system as recited in claim 4, wherein said first timing means causes said first multiplexing means to sample said first inputs more frequently than said second multiplexing means samples said second inputs.

6. The system as recited in claim 1, wherein said first timing means comprises a counter controlled by a clock.

7. The system as recited in claim 1, wherein said integrated circuitry, said first multiplexing means and said first timing means are disposed on a first integrated circuit chip.

8. The system as recited in claim 7, further comprising a second timing means disposed on a second circuit chip and interconnected with said analyzing means.

9. The system as recited in claim 8, wherein said first timing means comprises a counter controlled by a clock and said second timing means comprises a second counter also controlled by said clock.

10. The system as recited in claim 1, wherein said integrated circuitry and said first multiplexing means are disposed on a first circuit chip and said first timing means is disposed on a second circuit chip and is interconnected with said analyzing means.

11. The system as recited in claim 1, wherein said means for determining includes means for demultiplexing said stream of interleaved sample signals.

12. The system as recited in claim 1, wherein said analyzing means includes display means for displaying said signals substantially simultaneously.

13. The system as recited in claim 1, wherein at least one of said plurality of test nodes is interconnected with at least two of said first inputs.

14. A system for observing an integrated circuity comprising:
    a plurality of test nodes, with said plurality of test nodes being connected to different parts of a same, non-redundant integrated circuitry, said plurality of test nodes including first and second sets of test nodes;
    first multiplexing means having a plurality of first inputs and a first output, wherein a first number of said first inputs are interconnected with said first set of said test nodes, said plurality of first inputs having the same number as said plurality of test nodes, said plurality of first inputs being transmitted along a plurality of first input conductors and said first output being transmitted along a first output conductor and in which said first output conductor is less in number than said plurality of first input conductors;
    first timing means for causing said first multiplexing means to sequentially sample signals for said first inputs so as to produce an interleaved stream of said sample signals that comprises said first output, said first timing means operating at a frequency at least as high as the product of two, the number of said first inputs and the highest frequency of any of said first set of said test node signals;

second multiplexing means having a plurality of second inputs and a second output, wherein a second number of said second inputs are interconnected with said second set of said test nodes, said plurality of second inputs being the same in number as said second set of said plurality of test nodes, said plurality of second inputs being transmitted along a plurality of second input conductors and said second output being transmitted along a second output conductor and in which said second output conductor is less in number than said plurality of second input conductors;

second timing means for causing said second multiplexing means to sequentially sample signals for said second inputs so as to produce an interleaved stream of said sample signals that comprises said second output, said second timing means operating at a frequency at least as high as the product of two, the number of said second inputs and the highest frequency of any of said second set of test node signals; and analyzing means, interconnected with said first output conductor, for using said interleaved stream on said first output conductor to observe said integrated circuitry, said analyzing means receiving at least a first sample signal and a second sample signal in which said analyzing means receives a first sampled portion of said second sample signal before receiving a second sampled portion of said first sample signal, said analyzing means including means for determining that said second sampled portion of said first sample signal is to be reconstructed with said first sampled portion of said first sample signal.

15. The system as recited in claim 14, wherein said second set of test nodes produce signals having relatively slow transition rates as compared with transition rates of signals produced by said first set of test nodes.

16. A system for observing an integrated circuity, comprising:

a plurality of test nodes, with said plurality of test nodes being connected to different parts of a same, non-redundant integrated circuitry that is disposed on an integrated circuit chip;

first multiplexing means, disposed on said integrated circuit chip, having a plurality of first inputs and a first output, said plurality of first inputs being the same in number as said plurality of test nodes, said plurality of first inputs being transmitted along a plurality of first input conductors and said first output being transmitted along a first output conductor and in which said first output conductor is less in number than said plurality of first input conductors;

first counter means, disposed on said integrated circuit chip, for causing said multiplexing means to sequentially sample signals from said test nodes for said first inputs so as to produce an interleaved stream of said sample signals that comprises said first output;

analyzing means, interconnected with said first output conductor, for using said interleaved stream to observe said integrated circuitry, said analyzing means receiving at least a first sample signal and a second sample signal in which said analyzing means receives a first sampled portion of said second sample signal before receiving a second sampled portion of said first sample signal, said analyzing means including means for determining that said second sampled portion of said first sample signal is to be reconstructed with said first sampled portion of said first sample signal;

second counter means, disposed on a second circuit chip and interconnected with said analyzing means; and clock means for controlling both of said first and second counter means, said clock means operating at a frequency at least as high as the product of two, the number of said first inputs and the highest frequency of any of said test node signals.

17. The system of claim 16, wherein said means for determining includes means for using said second counter means to demultiplex said interleaved stream.

* * * * *